United States Patent
Hurley

(10) Patent No.: US 7,761,764 B2
(45) Date of Patent: Jul. 20, 2010

(54) SYSTEM AND METHOD FOR SELF-TEST OF INTEGRATED CIRCUITS

(75) Inventor: William M. Hurley, Murphy, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 777 days.

(21) Appl. No.: 11/622,873

(22) Filed: Jan. 12, 2007

(65) Prior Publication Data

US 2008/0172585 A1 Jul. 17, 2008

(51) Int. Cl.
*G01R 31/28* (2006.01)

(52) U.S. Cl. .................. 714/740; 714/30; 714/31; 714/32; 714/48; 714/712; 714/714; 714/715; 714/716; 714/717; 714/724; 714/728; 714/732; 714/733; 714/734; 714/736; 714/738; 714/739; 714/781; 714/807; 714/808; 370/242; 370/248; 370/249; 375/224

(58) Field of Classification Search .................. None
See application file for complete search history.

(56) References Cited

U.S. PATENT DOCUMENTS

| | | | | |
|---|---|---|---|---|
| 5,802,105 A | * | 9/1998 | Tiedemann et al. | 375/225 |
| 6,260,167 B1 | * | 7/2001 | Lo et al. | 714/744 |
| 6,510,398 B1 | * | 1/2003 | Kundu et al. | 702/117 |
| 6,760,873 B1 | * | 7/2004 | Hao et al. | 714/724 |
| 6,816,987 B1 | * | 11/2004 | Olson et al. | 714/704 |
| 6,856,802 B1 | * | 2/2005 | Kinnunen et al. | 455/425 |
| 6,915,471 B2 | * | 7/2005 | Miller | 714/738 |
| 6,918,074 B2 | * | 7/2005 | Kim et al. | 714/733 |
| 7,231,558 B2 | * | 6/2007 | Gentieu et al. | 714/704 |
| 7,596,175 B2 | * | 9/2009 | Chen | 375/229 |
| 2001/0022810 A1 | * | 9/2001 | Joo | 375/222 |

OTHER PUBLICATIONS

Ganguly et al., "Design of an On-Chip Pattern Generator Without Prohibited Pattern Set (PPS)", 2002, IEEE Conference on VLSI Design (VLSID'02), pp. 1-6.*

* cited by examiner

*Primary Examiner*—John P Trimmings

(57) ABSTRACT

A system and method for self-test of an integrated circuit are disclosed. As one example, an integrated circuit is disclosed. The integrated circuit includes a digital signal processing chain, a random sequence generator coupled to an input of the digital signal processing chain, and a checksum calculator coupled to an output of the digital signal processing chain.

20 Claims, 5 Drawing Sheets

SYSTEM AND METHOD FOR SELF-TEST OF INTEGRATED CIRCUITS

FIELD OF THE INVENTION

The invention is related to the integrated circuit (IC) manufacturing test field, and particularly, but not exclusively, to a system and method for self-test of ICs, such as, for example, ICs for Digital Signal Processing (DSP) types of applications.

BACKGROUND OF THE INVENTION

During the manufacture of IC devices including digital logic, an advantageous (but essentially required) approach is to perform some type of manufacturing test in order to prevent faulty devices from reaching the field. The primary goal of such tests is to thoroughly test all paths within each device under normal operating conditions. Unfortunately, such manufacturing test goals are not entirely practical. For example, well-known manufacturing test techniques, such as SCAN and MBIST, can test virtually all of the paths in a device but at a substantially reduced operating rate. These test techniques are problematic, because their reduced operating rates are far removed from the devices' normal operating conditions. Similarly, a manufacturing tester can apply functional vectors to a device, which can confirm a certain percentage of the device's functionality. However, this technique is also problematic, because the tests have to be performed at a reduced clock rate.

One approach currently used to increase manufacturing test coverage is the concept of At Speed Functional Testing (ASFT). The ASFT approach includes an embedded circuit in an IC device, which tests the functionality of the device at its full operating rate. For example, assume that the device to be tested is a device that routes data packets. An ASFT (embedded circuit) for such a device may contain predefined packets that the ASFT applies to the circuits in the device. The ASFT also monitors the output of the device, in order to confirm that the correct packets were routed to the correct destinations.

Notwithstanding the advantages of the existing ASFT approach, as digital signal processing encroaches further into the traditionally analog signal processing fields, such as in Radio Frequency ICs (RFICs), the specific mechanism of ASFT for such signal processing needs to be considered. For example, the data path for the digital logic has become digital values representing an analog signal instead of packets of data or transactions. Thus, the existing challenge for testing in this digitized environment is how to generate "analog" data, check that data, confirm functionality, and achieve a reasonably high coverage rate with the test involved. As such, one option may be to store a sampled waveform in memory, and essentially play that waveform out during the test process. Unfortunately, a substantial amount of memory would be required just to store such a waveform, which would dramatically increase the silicon area required for that device. Therefore, it would be desirable to have a test technique that provides ASFT or a similar approach for testing a digital signal processing chain in an IC device, with an analog broadband signal that toggles a relatively high percentage of the signal processing chain's data path registers, generation of the signal requires relatively little silicon area, and the signal is also repeatable. Such a technique could provide substantial test coverage of the functionality of the device, with a relatively small impact on its silicon area requirements, and tests could be performed at the normal operating speed of the device.

SUMMARY OF THE INVENTION

In a first example embodiment, an integrated circuit is provided. The integrated circuit includes a digital signal processing chain, a random sequence generator coupled to an input of the digital signal processing chain, and a checksum calculator coupled to an output of the digital signal processing chain.

In a second example embodiment, a system for self-test of an integrated circuit is provided. The system includes a digital signal processing chain arranged in the integrated circuit, an ASFT state machine arranged in the integrated circuit, the ASFT state machine coupled to the digital signal processing chain, an injection state machine arranged in the integrated circuit, the injection state machine coupled to the ASFT state machine and an input of the digital signal processing chain, at least one linear feedback shift register arranged in the integrated circuit, the at least one linear feedback shift register coupled to the injection state machine, a receive state machine arranged in the integrated circuit, the receive state machine coupled to the ASFT state machine and an output of the digital signal processing chain, and a checksum calculator arranged in the integrated circuit, the checksum calculator coupled to the ASFT state machine and the receive state machine.

In a third example embodiment, a method for self-test of an integrated circuit is provided. The method includes the steps of generating a repeatable pseudo-random sequence of data within the integrated circuit, injecting the repeatable pseudo-random sequence of data into an input of a digital signal processing chain within the integrated circuit, receiving processed data from an output of the digital signal processing chain within the integrated circuit, calculating a checksum value for the processed data within the integrated circuit, and comparing the checksum value with a predetermined signature value within the integrated circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
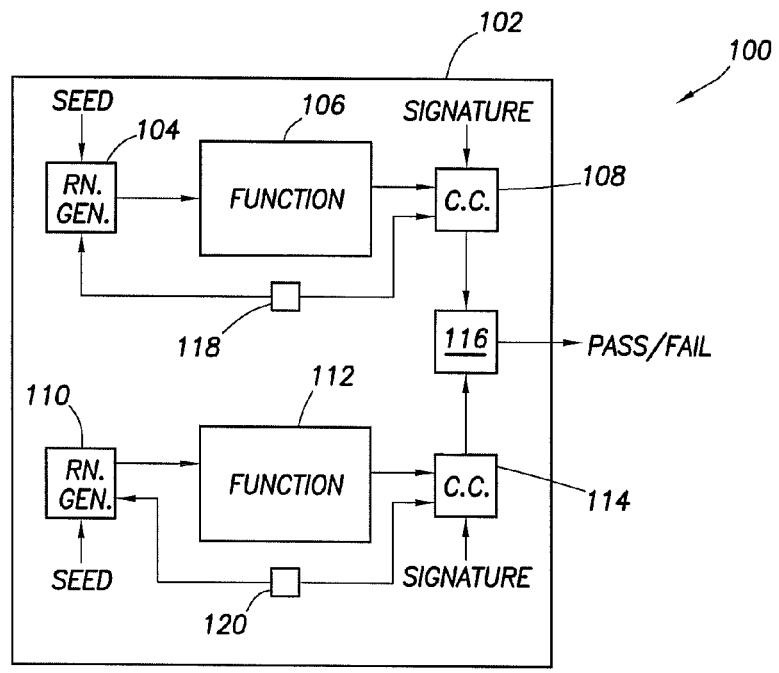
FIG. 1 depicts a functional block diagram of a system for self-test of an IC, which illustrates important principles of the present invention.

With reference now to the figures, FIG. 1 depicts a functional block diagram of a system 100 for self-test of an IC, which illustrates important principles of the present invention. For this illustrative example, an IC device 102 is shown, which includes a plurality of signal processing functions 106 and 112. In one example embodiment, IC device 102 may be implemented with a silicon die including suitable digital logic devices (e.g., gates, etc.). For example, IC device 102 may be implemented as an Application-Specific IC (ASIC), RFIC, or any other suitable IC device including digital signal processing functions. Note that although two signal processing functions 106, 112 are shown, the present invention is not intended to be so limited, and can include any suitable number of signal processing functions (e.g., one, three, four or more). As such, in one example embodiment, IC 102 may be an RFIC, and each signal processing function 106, 112 may be a digital signal processing chain, such as, for example, a wireless receiver chain, radiotelephone receiver chain, cellular receiver chain, or similar signal processing chain. In a different embodiment, each signal processing function 106, 112 may be, for example, a wireline receiver implemented in an IC.

For this illustrative example, IC device 102 includes a random number generator 104 coupled to an input of signal processing function 106. The random number generator 104 generates a repeatable pseudo-random number sequence of bits responsive to the application of a suitable initial value (e.g., seed). Thus, random number generator 104 produces a repeatable, simulated (e.g., sampled) wideband analog signal as an input stimulus for signal processing function 106. Responsive to the input stimulus, an output of signal processing function 106 is coupled to an input of a checksum calculator 108. The checksum calculator 108 calculates a checksum value (e.g., sum of the bits) from the data output from signal processing function 106. The checksum calculator 108 then compares the calculated checksum value with a predetermined signature value. Essentially, the signature value is a sum determined in advance by test personnel for a given set of test conditions and a given signal processing function configuration (e.g., test configuration representing the signal processing function involved). If the checksum calculator 108 determines that the calculated checksum value is equal to the known signature value, then the checksum calculator 108 can output a suitable signal indicating that the signal processing function 106 has passed the test. If the checksum calculator 108 determines that the calculated checksum value is not equal to the known signature value, then the checksum calculator 108 can output a suitable signal indicating that the signal processing function 106 has failed the test.

Also, for this illustrative example, IC device 102 includes a second random number generator 110 coupled to an input of a second signal processing function 112. The second random number generator 110 generates a second, repeatable pseudo-random number sequence of bits responsive to the application of a suitable, second initial value (e.g., seed). Thus, the second random number generator 110 produces a second, repeatable simulated (e.g., sampled) wideband analog signal as all input stimulus for the second signal processing function 112. Responsive to this input stimulus, an output of the second signal processing function 112 is coupled to an input of a second checksum calculator 114. The second checksum calculator 114 calculates a second checksum value from the data output from the second signal processing function 112. The second checksum calculator 114 then compares the second calculated checksum value with a second predetermined signature value. The second signature value is determined in advance by test personnel for a second given set of test conditions and a second given signal processing function configuration (e.g., test configuration representing a second signal processing function involved). If the second checksum calculator 114 determines that the second calculated checksum value is equal to the known second signature value, then the second checksum calculator 114 can output a suitable signal indicating that the second signal processing function 112 has passed that test. If the second checksum calculator 114 determines that the second calculated checksum value is not equal to the known second signature value, then the second checksum calculator 114 can output a suitable signal indicating that the signal processing function 106 has failed that test.

The pass/fail signal output of each checksum calculator 108, 114 is coupled to a respective input of an output control unit 116, which can convey the pass/fail indication from each checksum calculator off chip. Note that although each signal processing function 106, 112 is associated with a respective random number generator and checksum calculator, the arrangement shown is for illustrative purposes only, and the present invention is not intended to be so limited. For example, in a different embodiment, an IC device may be provided that includes only one random number generator and one checksum calculator suitably coupled (e.g., multiplexed) to each signal processing function to be tested in that IC device.

For this illustrative example, IC device 102 also includes a first coordinating control unit 118 coupled to a respective input of the first random number generator 104 and the first checksum calculator 108. Also, for this embodiment, a second coordinating control unit 120 is coupled to a respective input of the second random number generator 110 and the second checksum calculator 114. A primary function of the first coordinating control unit 118 is to coordinate the operations of the first random number generator 104 and the first checksum calculator 108. Similarly, a primary function of the second coordinating control unit 120 is to coordinate the operations of the second random number generator 110 and the second checksum calculator 114. Notably, in a different embodiment, the coordinating/control functions of first coordinating control unit 118 and second coordinating control unit 120 may be combined in one coordinating control unit (e.g., 118 or 120), and suitably coupling that unit to each of the first and second random number generators 104, 110, and the first and second checksum calculators 108, 114. As another option, for example, the coordinating/control functions of the first and second coordinating control units 118, 120 may be combined with the control functions of output control unit 116 in one device. In other words, a decision about whether or not to combine these control functions is a design choice, and is not a limitation to be imposed on the scope of coverage of the invention.

In one example embodiment of the present invention, a system for self-test of an IC is provided, which includes a linear feedback shift register (LFSR), a checksum calculator, and an ASFT control unit. The LFSR produces a simulated wideband analog signal as an input stimulus for the IC. The checksum calculator calculates a checksum value from the data output from the IC, and compares the calculated checksum value with a known signature value to determine a test pass or fail. The ASFT control unit coordinates the injection of the data and the checksum calculation, and reports the successful or unsuccessful completion of the test for the IC involved. Advantageously, the LFSR and checksum calculator can be provided in an IC device with minimal impact on the silicon area requirements of the device. Also, the testing can be performed at or near the normal operating speed of the device.

Figure 2:
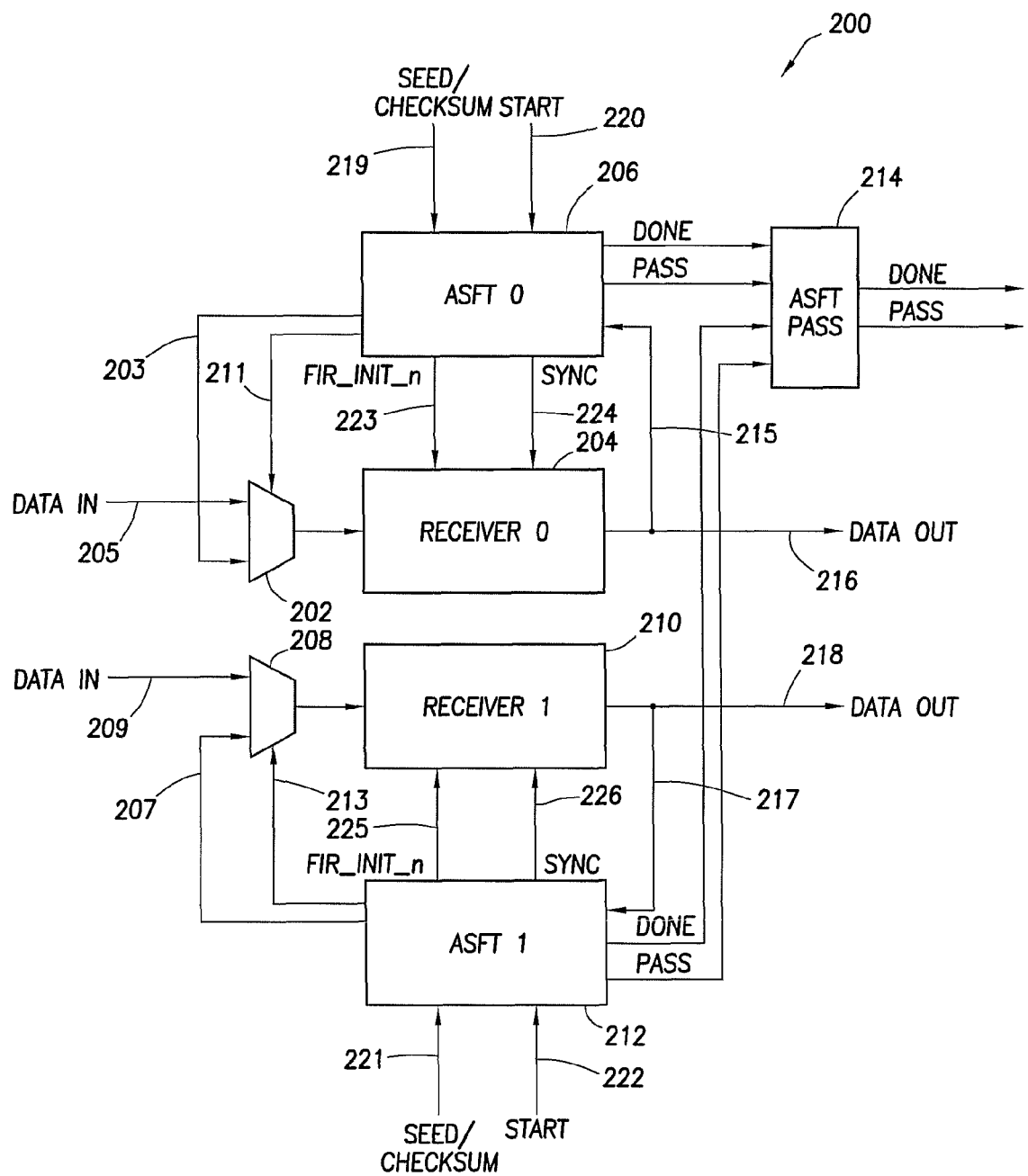
FIG. 2 depicts a schematic block diagram of a system for self-test of an IC, which can be used to implement an example embodiment of the present invention.

In this regard, FIG. 2 depicts a schematic block diagram of a system 200 for self-test of an IC, which can be used to implement an example embodiment of the present invention. For this illustrative embodiment, system 200 is shown in the exemplary context of ASFT for a two-channel digital receiver chain in an IC device. Note, however, that although a two-channel digital receiver chain is shown for this exemplary embodiment, the present invention is not intended to be so limited. For example, a different embodiment may include any number of suitable digital signal processing chains (e.g., one, three, four, and so on) in an ASIC, RFIC or other suitable type of IC device. Also note that the present invention is not intended to be limited only to the testing of digital receiver chains, and can include the testing of other types of digital signal processing functions in an IC device with a simulated wideband analog signal as a test input stimulus.

For this example embodiment, system 200 includes two digital receiver chains 204 and 210. For example, digital receiver chains 204 and 210 may be used to implement signal processing functions 106 and 112, respectively, in FIG. 1. System 200 also includes a first multiplexer 202 and a second multiplexer 208. An output of first multiplexer 202 is coupled to a data input of first digital receiver chain 204, and an output of second multiplexer 208 is coupled to a data input of second digital receiver chain 210.

Additionally, for this example embodiment, system 200 includes two ASFT units 206 and 212. An output of the first ASFT unit 206 is coupled to a test data input of first multiplexer 202 via line 203, and operational data (data in) can be coupled to a second input of first multiplexer 202 via line 205. Similarly, an output of the second ASFT unit 212 is coupled to a test data input of second multiplexer 208 via line 207, and operational data (data in) can be coupled to a second input of second multiplexer 208 via line 209. A control output of first ASH' unit 206 is coupled to a control input of first multiplexer 202 via line 211, and a control output of second ASFT unit 212 is coupled to a control input of second multiplexer 208 via line 213. Thus, responsive to a control signal from first ASFT unit 206, first multiplexer 202 can be used to convey input data from line 203 (test data) or line 205 (operational data) to first digital receiver chain 204. Similarly, responsive to a control signal from second ASFT unit 212, second multiplexer 208 can be used to convey input data from line 213 (test data) or line 209 (operational data) to second digital receiver chain 210. An output of first digital receiver chain 204 is coupled to an input of first ASFT unit 206 via line 215, and also to a first data out connection via line 216. Similarly, an output of second digital receiver chain 210 is coupled to an input of second ASFT unit 212 via line 217, and also to a second data out connection via line 218. The first ASFT unit 206 also has a seed/checksum input via line 219 and outputs FIR_INIT_n via line 223. The second ASFT unit 212 also has a seed/checksum input via line 221 and outputs FIR_INIT_n via line 225.

For this example embodiment, system 200 also includes an ASFT pass (or fail) unit 214. A primary function of ASFT pass unit 214 is to receive a test completion signal (done) and/or a test pass (or fail) signal from either the first ASFT unit 206 or the second ASFT unit 212, and convey the received signal(s) to a respective test output connection for the IC device involved. For example, ASFT pass unit 214 may be used to implement the output control unit 116 shown in FIG. 1.

Figure 3:
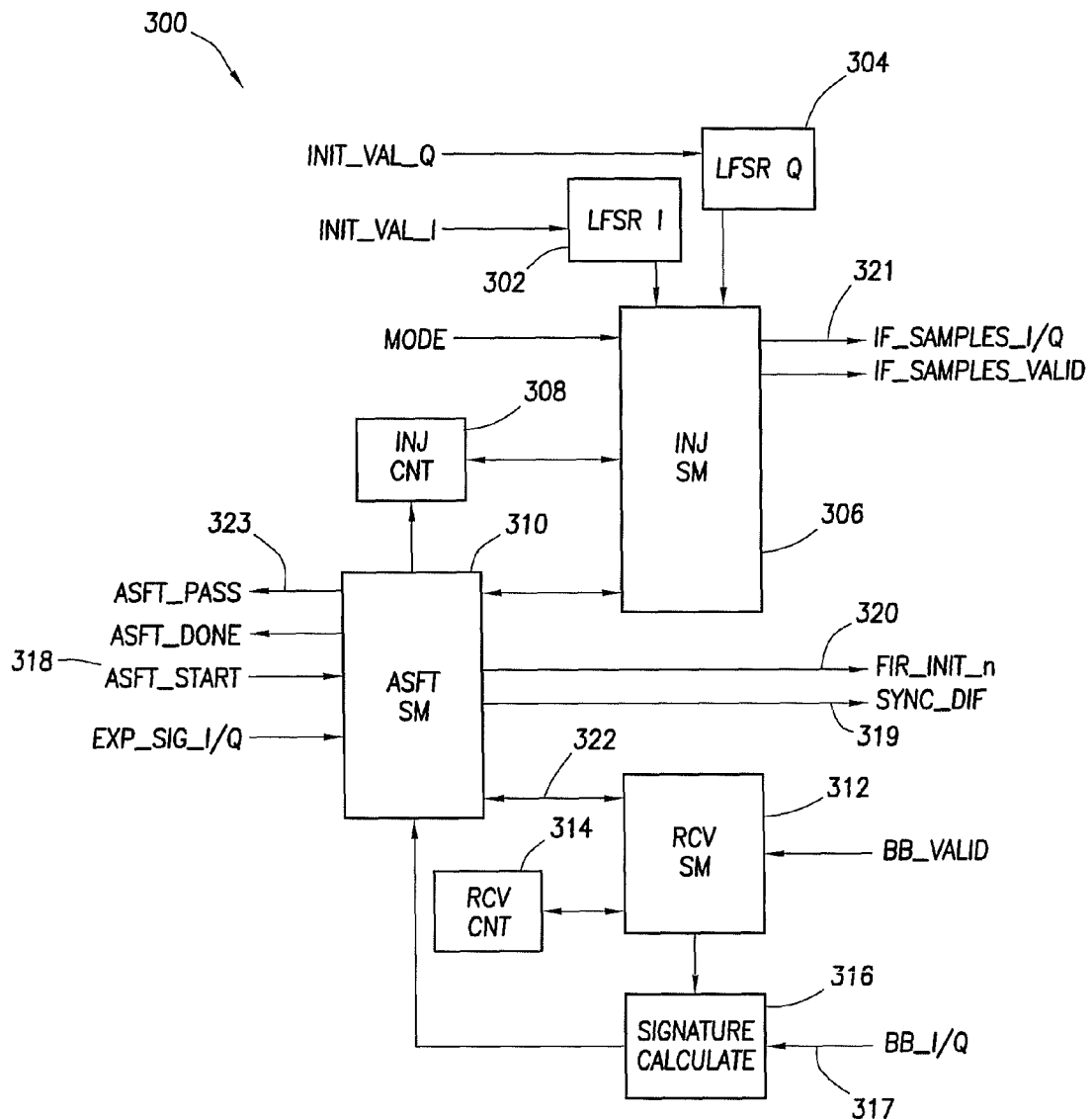
FIG. 3 depicts a schematic block diagram of the details of an exemplary ASFT unit, which can be used to implement the first ASFT unit or the second ASFT unit in the example embodiment shown in FIG. 2.

FIG. 3 depicts a schematic block diagram of the details of an exemplary ASFT unit 300, which can be used to implement first ASFT unit 206 or second ASFT unit 212 in the example embodiment shown in FIG. 2. For this illustrative example, ASFT unit 300 includes a first LFSR 302 and a second LFSR 304. Each of the first LFSR 302 and the second LFSR 304 can be implemented, for example, with suitable hardware, software, or a combination thereof. An output of each LFSR 302 and 304 is coupled to a respective input of an injection state machine 306. Note that although an example configuration of two LFSRs 302 and 304 is shown, this arrangement is based on a particular design choice, and the present invention is not intended to be so limited. For example, referring to the example embodiment depicted in FIG. 2, each digital receiver chain 204 and 210 can be implemented in an RFIC in which each digital receiver chain 204 and 210 is capable of processing both I and Q signal components. In that regard, for this example embodiment, the first LFSR 302 is provided for generating I signal components, and the second LFSR 304 is provided for generating Q signal components. In a different embodiment, if a non-orthogonal modulation technique is to be used in a digital receiver chain, then one such LFSR may be used.

For this example embodiment, ASFT unit 300 also includes an injection control unit 308 coupled to the injection state machine 306 and an ASFT state machine 310. Under the overall control of the ASFT state machine 310, the injection control unit 308 can control the execution of the injection state machine 306. As such, in this example embodiment, the injection state machine 306 is implemented (e.g., with hardware, software, or a combination thereof) as a low level driver, which is capable of inputting data into the associated digital receiver chain. In this regard, a primary function of injection state machine 306 is to inject the repeatable, pseudo-random sequence of test data bits generated by each LFSR 302 and 304 into the I and Q signal processing sections of the associated digital receiver chain (e.g., digital receiver chain 204 or 210 in FIG. 2). As discussed earlier, the repeatable, pseudo-random sequence of data bits represents a (sampled) wideband analog signal, which can be used for self-test as a broadband input stimulus for the digital receiver chain involved.

Additionally, for this example embodiment, ASFT unit 300 includes a receive state machine 312 coupled to the ASFT state machine 310, a receive control unit 314, and a signature calculation unit 316. Under the overall control of the ASFT state machine 310, the receive control unit 314 can control the execution of the receive state machine 312. As such, in this example embodiment, the receive state machine 312 is implemented (e.g., with hardware, software, or a combination thereof) as a driver, which is capable of receiving output data from the digital receiver chain involved. Also, for this example embodiment, in conjunction with the signature calculation unit 316, the receive state machine 312 can perform the checksum calculations for the output data received (e.g., via the baseband I/Q line 317). Each calculated checksum value is coupled from the signature calculation unit 316 to the ASFT state machine 310 for comparison with a known signature (sum) value.

Figure 4:
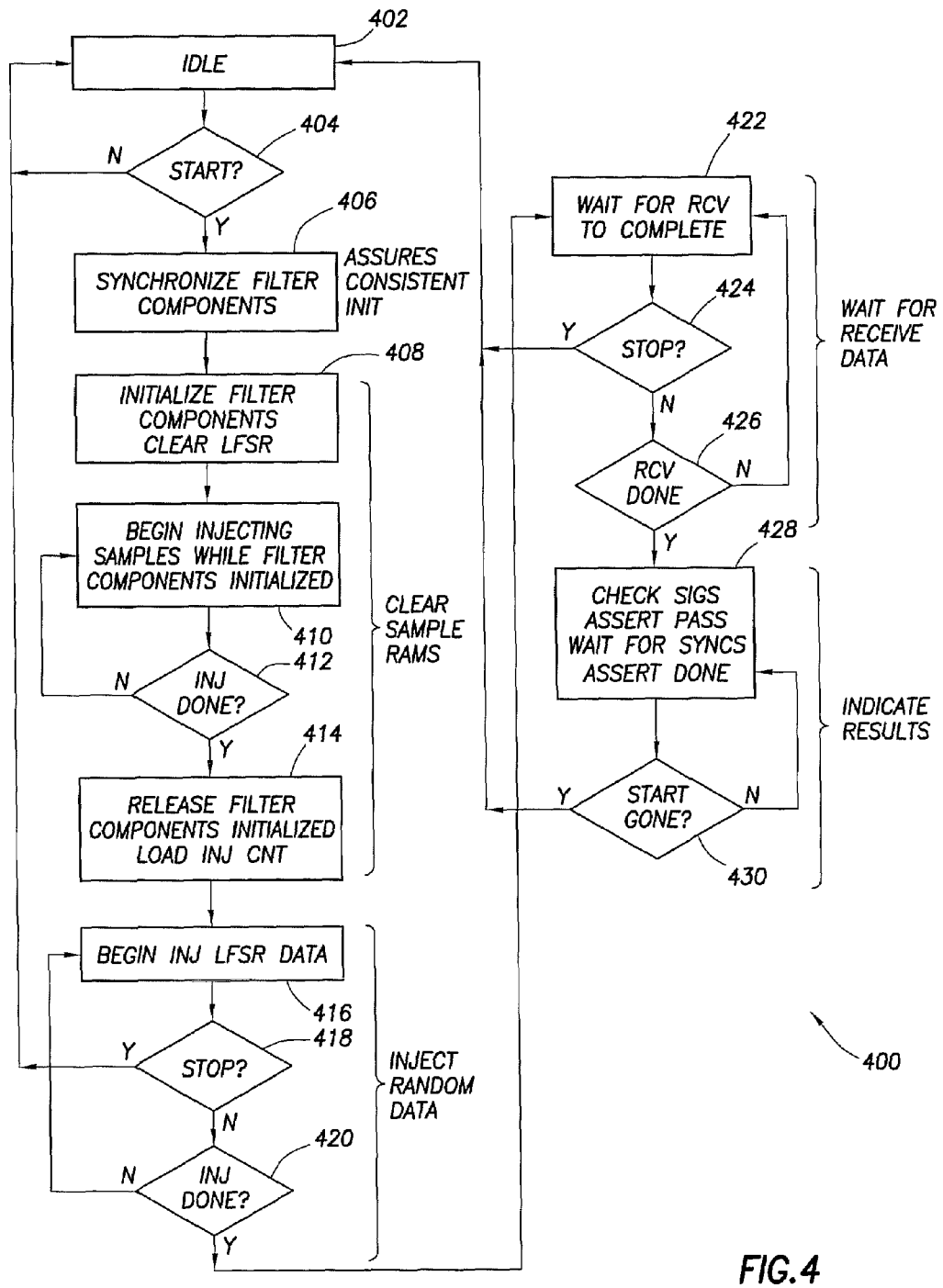
FIG. 4 is a flowchart depicting an exemplary method for self-test of a digital signal processing chain in an IC device, which can be used to implement an example embodiment of the present invention.

FIG. 4 is a flowchart depicting an exemplary method 400 for self-test of a digital signal processing chain in an IC device, which can be used to implement an example embodiment of the present invention. For this example embodiment, the steps of method 400 can be executed by ASFT state machine 310. Thus, it should be readily understood that the steps of method 400 may be executed in an ASFT state machine associated with either first ASFT unit 206 or second ASFT unit 212 shown in FIG. 2.

Referring now to FIGS. 2, 3 and 4 for this example embodiment, ASFT state machine 310 begins the execution of method 400 in an idle or wait state (step 402). In other words, ASFT state machine 310 waits to determine whether or not an ASFT start signal has been received (e.g., via line 318 in FIG. 3). For example, a test person (or automated tester) can input a suitable ASFT start signal via an input lead of the IC device involved, which can be conveyed to the appropriate ASFT unit in the device (e.g., via line 220 or line 222 in FIG. 2). If ASFT state machine 310 determines that no ASFT start signal has been received (step 404), the flow returns to the idle state (step 402). However, if (at step 404) ASFT state machine 310 determines that an ASFT start signal has been received, then ASFT state machine 310 begins an initialization process for the digital receiver chain (e.g., 204 or 210) involved. Note that this initialization process is a design choice, which is intended to ensure that the signal processing chain to be tested is in a known initial state in order to enhance repeatability.

First, in this regard, filter components in each digital receiver chain are synchronized (step 406). For this example embodiment, during a suitable time interval, ASFT state machine 310 conveys a suitable synchronization signal via line 319 to digital signal processing components in the digital receiver chain involved. For example, the synchronization signal may be conveyed from an ASFT state machine associated with the first ASFT unit 206 to digital receiver chain 204 via line 224, or from an ASFT state machine associated with the second ASFT unit 212 to digital receiver chain 210 via line 226.

Next, the filter components in each digital receiver chain are initialized, and the one or more LFSRs is/are cleared (step 408). For this example embodiment, during a second time interval, ASFT state machine 310 conveys a suitable initialization value via line 320 to the digital signal processing components, and also clears the I and/or Q LFSR 302, 304 involved. Additionally, during the time interval while the digital signal processing components are initialized, ASFT state machine 310 conveys a suitable control signal to the injection control unit 308 (step 410). This control signal causes the injection state machine 306 to begin the process of injecting suitable signals (e.g., via line 321) into storage RAM in the digital receiver chain 204 or 210 involved. A primary purpose of this step is to clear the storage RAM in that digital receiver chain. The ASFT state machine 310 then determines whether or not the process of injecting these signals into the RAMs has been completed (step 412). If not, the flow returns to step 410 to continue the RAM injection and clearance process.

Returning to step 412, if the ASFT state machine 310 determines that the process of injecting the signals into the RAMs has been completed, then the ASFT state machine 310 releases the digital signal processing components from the initialization state for a suitable time interval equal, and also loads the injection control Unit 308 with a suitable control signal that causes the injection state machine 306 to begin injecting LFSR-generated data into the digital receiver chain involved (step 414). Responsive to receiving the control signal from the injection control unit 308, the injection state machine 306 begins injecting the pseudo-random data generated by LFSR 302 and/or LFSR 304 into the digital receiver chain involved (step 416). This injected pseudo-random data sequence is repeatable, and simulates a sampled analog wideband signal.

Specifically, the ASFT unit can achieve a reasonably high amount of test coverage by injecting broadband noise, which produces a relatively large number of bit patterns in the digital signal processing chain involved. For this example embodiment, the pseudo-random data is generated by a maximum length LFSR (e.g., 302 or 304) with the characteristic polynomial $P(x)=x^{18}+x^{11}+1$, which can provide serial run lengths of $2^{18}-1$. In this example embodiment, the LFSR is calculated 18 bits at a time, which provides approximately 14,563.5 samples before the LFSR rolls over or repeats. Consequently, the LFSR can generate 29,127 samples before the injection pattern repeats. In a different embodiment, a different polynomial can be used to generate as long a sample sequence as desired.

Figure 5:
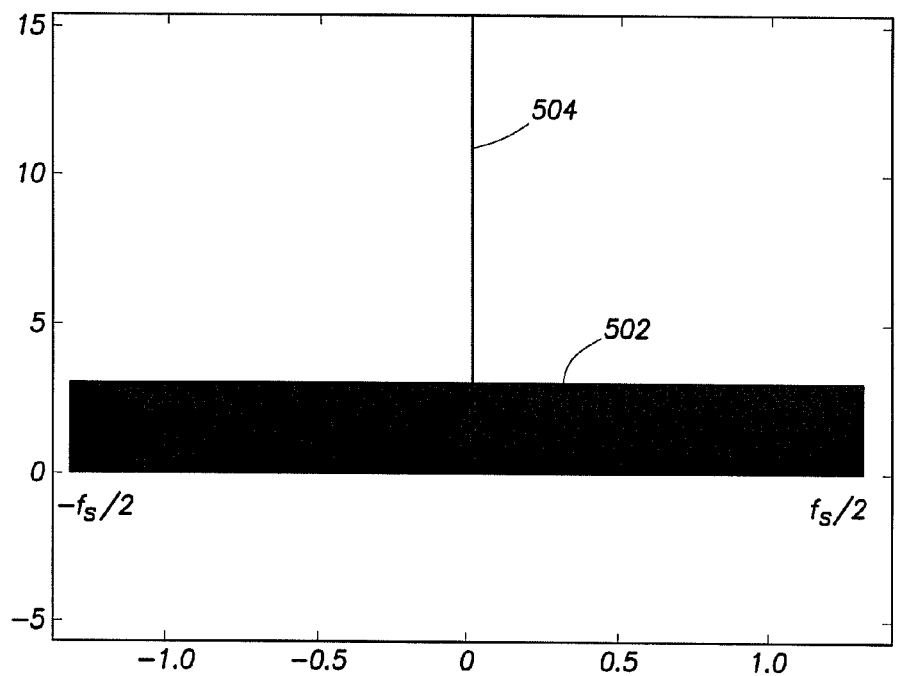
FIG. 5 is a graph depicting a histogram of data bit values injected in a simulation with a 65,536 sample injection sequence.

The pseudo-random sequence generated by the LFSR is unique to the initial condition of the LFSR prior to running the test. Consequently, a mechanism is provided that can be used to run a virtually unlimited number of "analog" waveforms, and each sequence is repeatable. Additionally, the LFSR-generated data used for injection purposes is statistically random. For example, FIG. 5 is a graph 500 depicting a histogram 502 of data bit values injected in a simulation with a 65,536 sample injection sequence. Note that the histogram 502 is reasonably flat, with an anomaly 504 at "zero" due to the zero flushing that occurred at the start of the ASFT test. As shown, the input sequence covers a relatively high percentage of the possible input values.

Figure 6:
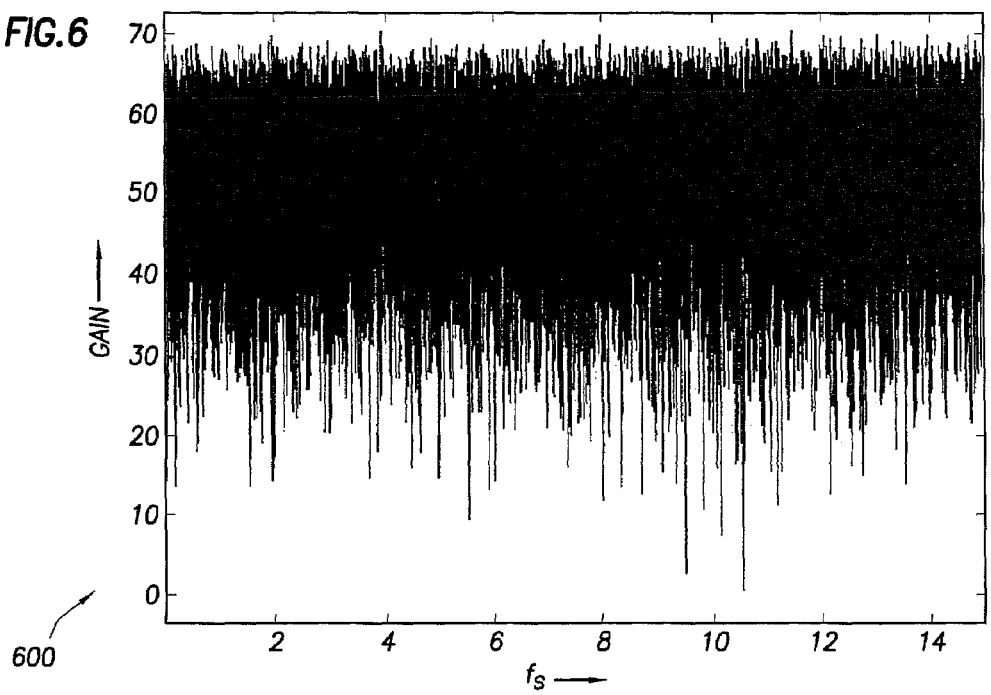
FIG. 6 is a graph depicting the frequency spectrum of an LFSR-generated input sequence applied in a typical wireless receiver.

With respect to using an LFSR-generated data sequence as an analog source, FIG. 6 is a graph depicting the frequency spectrum 600 of an LFSR-generated input sequence applied in a typical wireless receiver. As shown, the input sequence approximates a wideband data source, which includes frequency content across all ranges that typically would be affected by signal processing.

Figure 7:
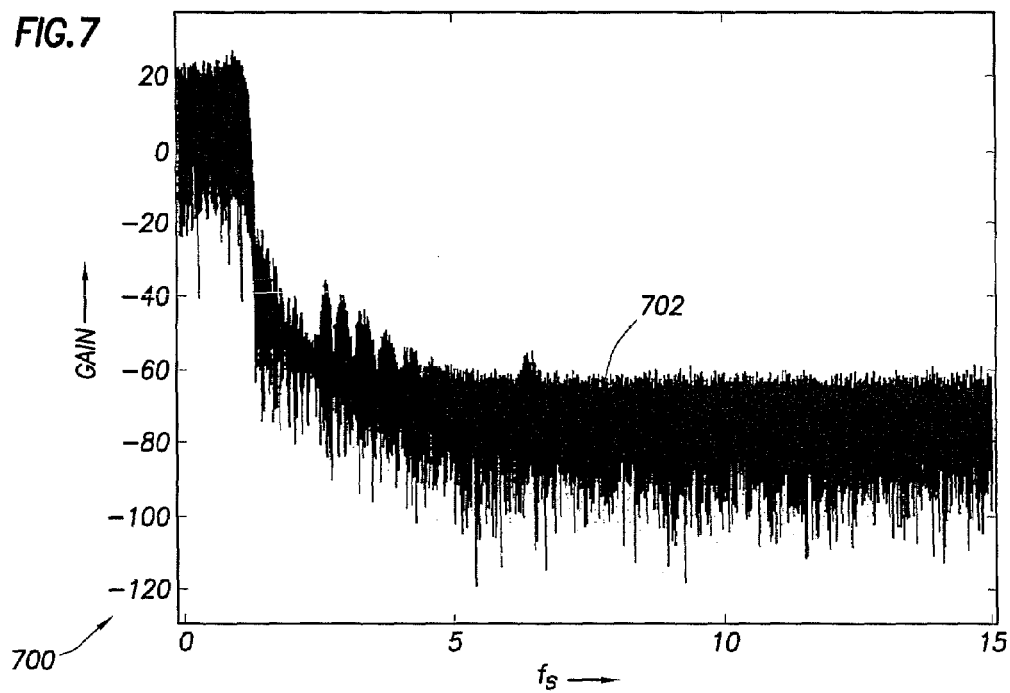
FIG. 7 is a graph depicting an example output of a typical wireless receiver after LFSR-generated data has been processed.

FIG. 7 is a graph depicting an example output 700 of a typical wireless receiver after LFSR-generated data has been processed. Basically, FIG. 7 shows that the receiver has manipulated the LFSR-generated data successfully, and the output response 702 of the receiver appears normal across the wide band of frequencies involved.

Returning to the exemplary method 400 shown in FIG. 4, for design purposes in this example embodiment, the ASFT state machine 310 determines whether or not to terminate the test process (step 418). If the ASFT state machine 310 determines that the test process should be terminated, then the flow proceeds back to the idle step (step 402). If (at step 418) the ASFT state machine 310 determines that the test process should not be terminated, then the ASFT state machine 310 determines whether or not the LFSR-generated data injection process has been completed (step 420). If not, the flow returns to step 416. However, if (at step 420) the ASFT state machine 310 determines that the LFSR-generated data injection process has been completed, then the ASFT state machine 310 waits for a suitable signal from the receive state machine 312 (e.g., via line 322), which indicates that the receive process of the digital receive chain has been completed (step 422). At this point, for design purposes in this example embodiment, the ASFT state machine 310 again determines whether or not to terminate the test process (step 424). If so, then the flow returns to the idle step (step 402). If a determination is made that the test process should not be terminated, then the ASFT state machine 310 determines whether or not the receive process for the digital receive chain has been completed (step 426). If the receive process has not been completed, then the flow returns to step 422.

For this example embodiment, the success (or lack of success) of the test is determined by monitoring the data output from the digital receiver chain (e.g., via line 215 or line 217), calculating the 1's complement sum of the output, and summing the carry with the least significant bit (LSB) on each summing calculation. The output sum (checksum) is compared to a signature value (sum), which is determined ahead of time by the manufacturing tester involved. The signature value can be determined by running the ASFT test with the appropriate seeds and length through a digital simulator, thus determining the output checksum for a given digital signal processing chain configuration. If the same test yields a different checksum when the test is run on an actual device, a manufacturing fault is indicated. If the same test yields the same checksum on the actual device, then no manufacturing fault is indicated. In this regard, the ASFT state machine 310 can output a signal reporting a "fail" or "pass" (e.g., via line 323).

Returning to step 426 of method 400, if the ASFT state machine 310 determines that the receive process has been completed, the ASFT state machine then determines if a pass (or fail) condition has occurred before the test has been completed, and asserts that pass (or fail) condition and indicates test completion (done) (step 428). Next (at step 430), if the manufacturing test equipment has not acknowledged receipt of the test results by removing the start signal, then the flow returns to step 428. If (at step 430) the start signal has been removed, which indicates receipt of the test results by the manufacturing test equipment, the flow returns to the idle step (step 402).

The description of the present invention has been presented for purposes of illustration and description, and is not intended to be exhaustive or limited to the invention in the form disclosed. Many modifications and variations will be apparent to those of ordinary skill in the art. These embodiments were chosen and described in order to best explain the principles of the invention, the practical application, and to enable others of ordinary skill in the art to understand the invention for various embodiments with various modifications as are suited to the particular use contemplated.

What is claimed is:

1. An integrated circuit, comprising: a digital signal processing chain;
   a random sequence generator coupled to an input of the digital signal processing chain; and
   a checksum calculator coupled to an output of the digital signal processing chain, wherein the random sequence generator is configured to generate a simulated wideband analog signal as an input stimulus for the digital signal processing chain.

2. The integrated circuit of claim 1, wherein the random sequence generator is
   configured to generate a pseudo-random sequence of data responsive to a seed.

3. The integrated circuit of claim 1, wherein the checksum calculator is configured
   to calculate a sum for data received from the output of the digital signal processing chain, and compare the sum with a signature value.

4. The integrated circuit of claim 1, wherein the random sequence generator is a
   linear feedback shift register.

5. The integrated circuit of claim 1, wherein the digital signal processing chain is a
   digital receiver chain in a wireless radiotelephone receiver.

6. The integrated circuit of claim 1, wherein the integrated circuit is an RFIC.

7. The integrated circuit of claim 1, wherein the integrated circuit is an ASIC.

8. The integrated circuit of claim 1, wherein the random sequence generator is a linear feedback shift register.

9. A system for self-test of an integrated circuit, comprising:
   a digital signal processing chain arranged in the integrated circuit;
   an ASFT state machine arranged in the integrated circuit, the ASFT state machine coupled to the digital signal processing chain;
   an injection state machine arranged in the integrated circuit, the injection state machine coupled to the ASFT state machine and an input of the digital signal processing chain;
   at least one linear feedback shift register arranged in the integrated circuit, the at least one linear feedback shift register coupled to the injection state machine;
   a receive state machine arranged in the integrated circuit, the receive state machine coupled to the ASFT state machine and an output of the digital signal processing chain; and
   a checksum calculator arranged in the integrated circuit, the checksum calculator coupled to the ASFT state machine and the receive state machine.

10. The system of claim 9, wherein the at least one linear feedback shift register is configured to output a pseudo-random sequence of data, the injection state machine is configured to inject the pseudo-random sequence of data into the digital signal processing chain, the receive state machine is configured to receive output data from the digital signal processing chain, and the checksum calculator is configured to calculate a sum associated with the output data received by the receive state machine, and compare the sum with a signature value.

11. The system of claim 9, wherein the at least one linear feedback shift register is a
    maximum length linear feedback shift register.

12. The system of claim 9, wherein the ASFT state machine is configured to control operations of the injection state machine and the receive state machine.

13. The system of claim 9, wherein the at least one linear feedback shift register
    comprises a plurality of linear feedback shift registers, a first linear feedback shift register is configured to generate an I signal component for a quadrature modulated signal, and a second linear feedback shift register is configured to generate a Q signal component for the quadrature modulated signal.

14. The system of claim 9, wherein the checksum calculator is configured to calculate an 18 bit sum associated with the output data received by the receive state machine, and compare the 18 bit sum with a predetermined signature value.

15. A method for self-test of an integrated circuit, the method comprising the steps of:
    generating a repeatable pseudo-random sequence of data within the integrated circuit
    generating a second repeatable pseudo-random sequence of data within the integrated circuit; wherein the repeatable pseudo-random sequence of data represents an I component of a signal, and the second repeatable pseudo-random sequence of data represents a Q component of the signal;

injecting the repeatable pseudo-random sequence of data into an input of a digital signal processing chain within the integrated circuit;

receiving processed data from an output of the digital signal processing chain within the integrated circuit;

calculating a checksum value for the processed data within the integrated circuit; and comparing the checksum value with a predetermined signature value within the integrated circuit.

16. The method of claim 15, further comprising the steps of:
   indicating a pass condition if the checksum value is equal to the predetermined signature value.

17. The method of claim 15, further comprising the steps of:
   indicating a fail condition if the checksum value is not equal to the predetermined signature value.

18. The method of claim 15, wherein the calculating step comprises a step of calculating a 1's complement sum of the processed data.

19. The method of claim 15, wherein the generating step is performed responsive to a seed value.

20. The method of claim 15, wherein the generating step is performed by a linear feedback shift register, and the calculating step is performed by a checksum calculator.

* * * * *